US012580114B2

(12) United States Patent 
Nakano et al.

(10) Patent No.: US 12,580,114 B2 
(45) Date of Patent: Mar. 17, 2026

(54) MAGNETOSTRICTIVE FILM AND ELECTRONIC DEVICE

(71) Applicant: TDK CORPORATION, Tokyo (JP)

(72) Inventors: Mutsuko Nakano, Tokyo (JP); Yasuhisa Okano, Tokyo (JP); Takao Noguchi, Tokyo (JP); Wakako Okawa, Tokyo (JP); Yoshitomo Tanaka, Tokyo (JP)

(73) Assignee: TDK CORPORATION, Tokyo (JP)

( * ) Notice: Subject to any disclaimer, the term of this patent is extended or adjusted under 35 U.S.C. 154(b) by 110 days.

(21) Appl. No.: 18/498,337

(22) Filed: Oct. 31, 2023

(65) Prior Publication Data

US 2024/0145146 A1 May 2, 2024

(30) Foreign Application Priority Data

Nov. 2, 2022    (JP) ................................. 2022-176468 
Sep. 1, 2023    (JP) ................................. 2023-142206

(51) Int. Cl.

| | |
|---|---|
| *H01F 10/13* | (2006.01) |
| *G01L 23/14* | (2006.01) |
| *G01R 33/18* | (2006.01) |
| *H10N 35/80* | (2023.01) |
| *H10N 35/85* | (2023.01) |

(52) U.S. Cl. 
CPC .......... *H01F 10/136* (2013.01); *G01L 23/145* (2013.01); *G01R 33/18* (2013.01); *H10N 35/80* (2023.02); *H10N 35/85* (2023.02); *Y10T 428/32* (2015.01)

(58) Field of Classification Search 
None 
See application file for complete search history.

(56) References Cited

U.S. PATENT DOCUMENTS

| | | | | |
|---|---|---|---|---|
| 5,985,049 A | * | 11/1999 | Pinkerton | H10N 35/85 |
| | | | | 420/83 |
| 6,279,406 B1 | * | 8/2001 | Li | G01R 33/18 |
| | | | | 73/861.08 |
| 2003/0217786 A1 | * | 11/2003 | Mori | H10N 35/85 |
| | | | | 148/121 |
| 2006/0174726 A1 | * | 8/2006 | Mori | C22C 1/047 |
| | | | | 75/316 |
| 2006/0174976 A1 | * | 8/2006 | Mori | H10N 35/01 |
| | | | | 148/105 |
| 2006/0244398 A1 | | 11/2006 | Kitamura et al. | |
| 2007/0241849 A1 | * | 10/2007 | Heinrich | H10N 35/85 |
| | | | | 335/215 |
| 2012/0128970 A1 | | 5/2012 | Motoe et al. | |
| 2018/0033947 A1 | * | 2/2018 | Varghese | G01R 33/18 |
| 2018/0076261 A1 | * | 3/2018 | Yoshikawa | H10N 50/01 |
| 2020/0066963 A1 | * | 2/2020 | Johnson | H10N 30/852 |
| 2022/0165468 A1 | * | 5/2022 | Bandyopadhyay | H04M 1/03 |

FOREIGN PATENT DOCUMENTS

| | | |
|---|---|---|
| JP | H06-220602 A | 8/1994 |
| JP | 2006-310648 A | 11/2006 |
| WO | 2011/016399 A1 | 2/2011 |

* cited by examiner

*Primary Examiner* — Kevin M Bernatz 
(74) *Attorney, Agent, or Firm* — OLIFF PLC

(57) ABSTRACT

A magnetostrictive film includes rich regions having a mesh pattern in a cross section perpendicular to a film thickness direction of the magnetostrictive film. The rich regions are richer in a specific element contributing to ferromagnetism than surroundings of the rich regions.

11 Claims, 12 Drawing Sheets

FIG. 3

FIG. 4A1
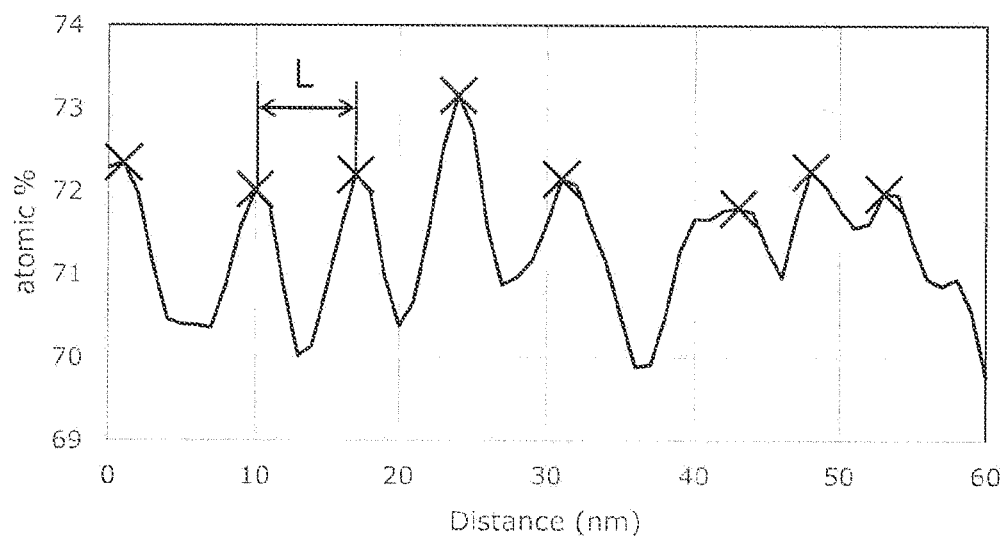
FIG. 4A2
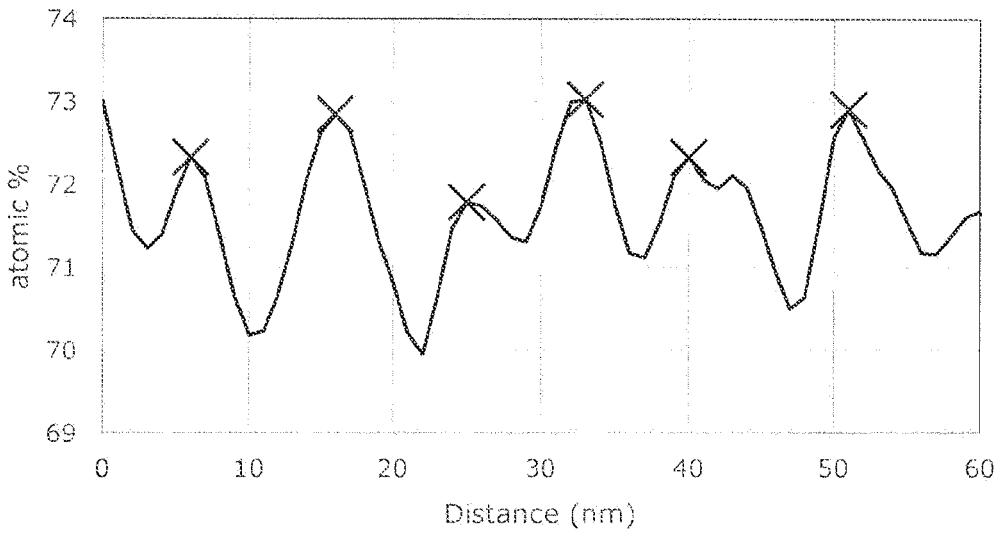

MAGNETOSTRICTIVE FILM AND ELECTRONIC DEVICE

CROSS-REFERENCE TO RELATED APPLICATIONS

The present application claims priority from Japanese Patent Application No. 2022-176468 filed on Nov. 2, 2022, and Japanese Patent Application No. 2023-142206 filed on Sep. 1, 2023, the entire contents of which are hereby incorporated by reference.

BACKGROUND

The present disclosure relates to a magnetostrictive film and an electronic device including the magnetostrictive film.

Magnetostrictive films disclosed in, for example, Patent Document 1 or Patent Document 2 have magnetostriction, which is a property that causes displacement, such as expansion and contraction, when an external magnetic field is applied. The magnetostrictive films are applied to various electronic devices, such as actuators, speakers, magnetometers, power generation devices, and energy conversion devices.

When the magnetostrictive films are used in vibration actuators or speakers, the larger the magnetostriction constant $d\lambda/dH$, the faster the start of the devices for a current. Also, the larger the magnetostriction constant $d\lambda/dH$, the larger the change (sensitivity) of magnetization in response to a stress. To enable the magnetostrictive films in the electronic devices to produce an output for a small external magnetic field, not only having a large magnetostriction constant $d\lambda/dH$ but also having a low magnetic field threshold $H_{TH}$ has been in demand for the magnetostrictive films.

Patent Document 1: WO 2011/016399

Patent Document 2: JP H6-220602 (A)

SUMMARY

It is desirable to provide a magnetostrictive film having a large magnetostriction constant $d\lambda/dH$ and having a low magnetic field threshold $H_{TH}$ and an electronic device including the magnetostrictive film.

The following means are provided.

A magnetostrictive film includes rich regions having a mesh pattern in a cross section perpendicular to a film thickness direction of the magnetostrictive film, the rich regions being richer in a specific element contributing to ferromagnetism than surroundings of the rich regions.

An electronic device includes the magnetostrictive film.

BRIEF DESCRIPTION OF THE DRAWING(S)

FIG. 3 is an Fe mapping image of a longitudinal section parallel to the film thickness direction of the magnetostrictive film sample according to the same example of FIG. 2, analyzed by the three-dimensional atom probe.

Figure 1:
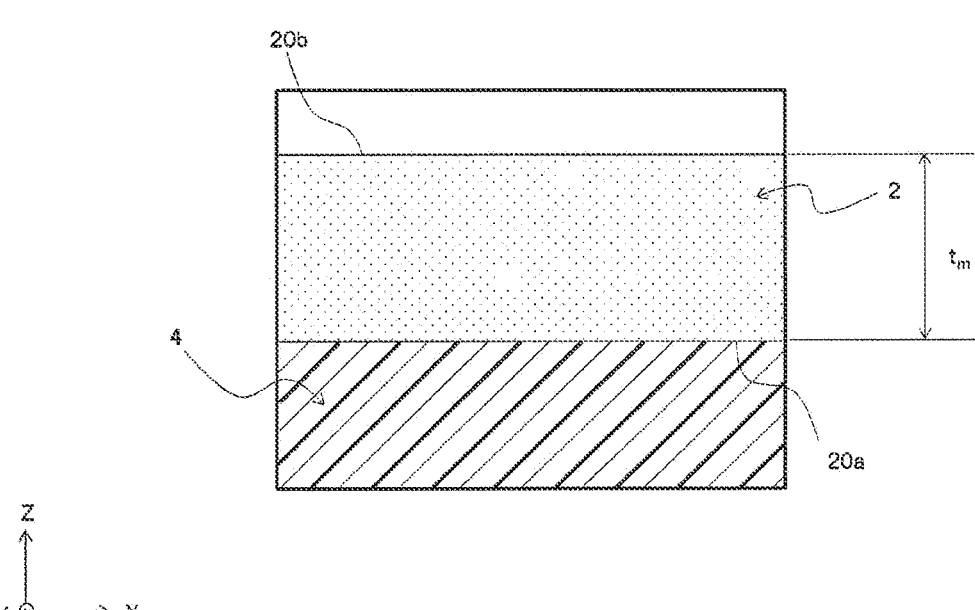
FIG. 1 is a sectional view of a main part of a magnetostrictive film according to an embodiment of the present disclosure.
Figure 2:
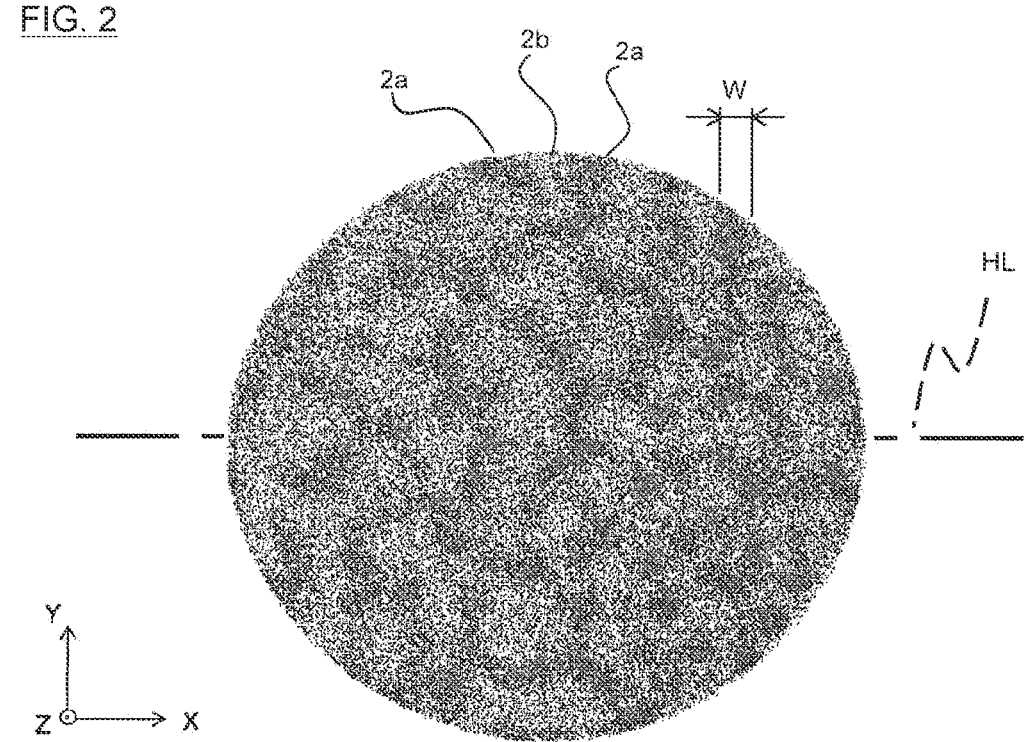
FIG. 2 is an Fe mapping image of a cross section perpendicular to a film thickness direction of a magnetostrictive film sample according to an example of the present disclosure, analyzed by a three-dimensional atom probe.

FIG. 4A1 is a graph of an Fe concentration profile measured along an imaginary straight line shown in FIG. 2.

FIG. 4A2 is a graph of an Fe concentration profile of another example measured as in FIG. 4A1.

Figure 4B:
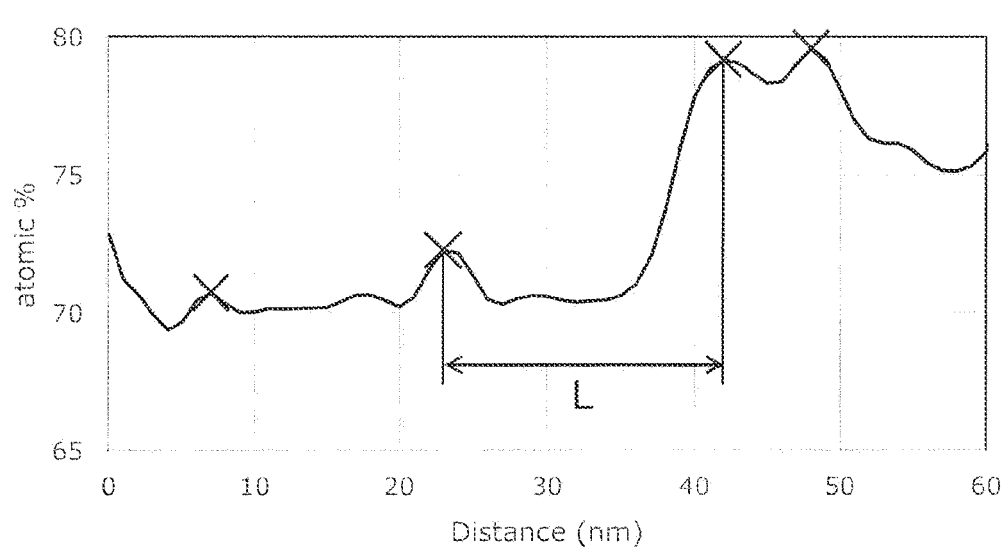

FIG. 4B is a graph of an Fe concentration profile of a magnetostrictive film sample according to a comparative example of the present disclosure, measured as in FIG. 4A1.

Figure 5:
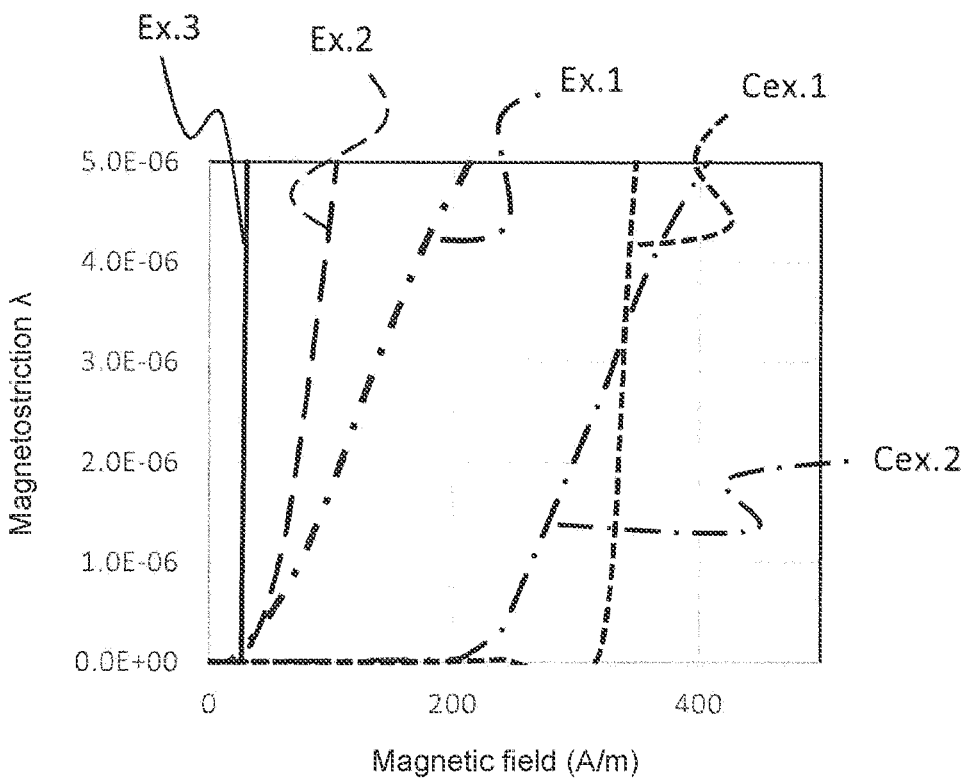

FIG. 5 is a graph showing relationships between magnetic fields and magnetostriction $\lambda$ of magnetostrictive film samples according to examples and comparative examples of the present disclosure.

Figure 6:
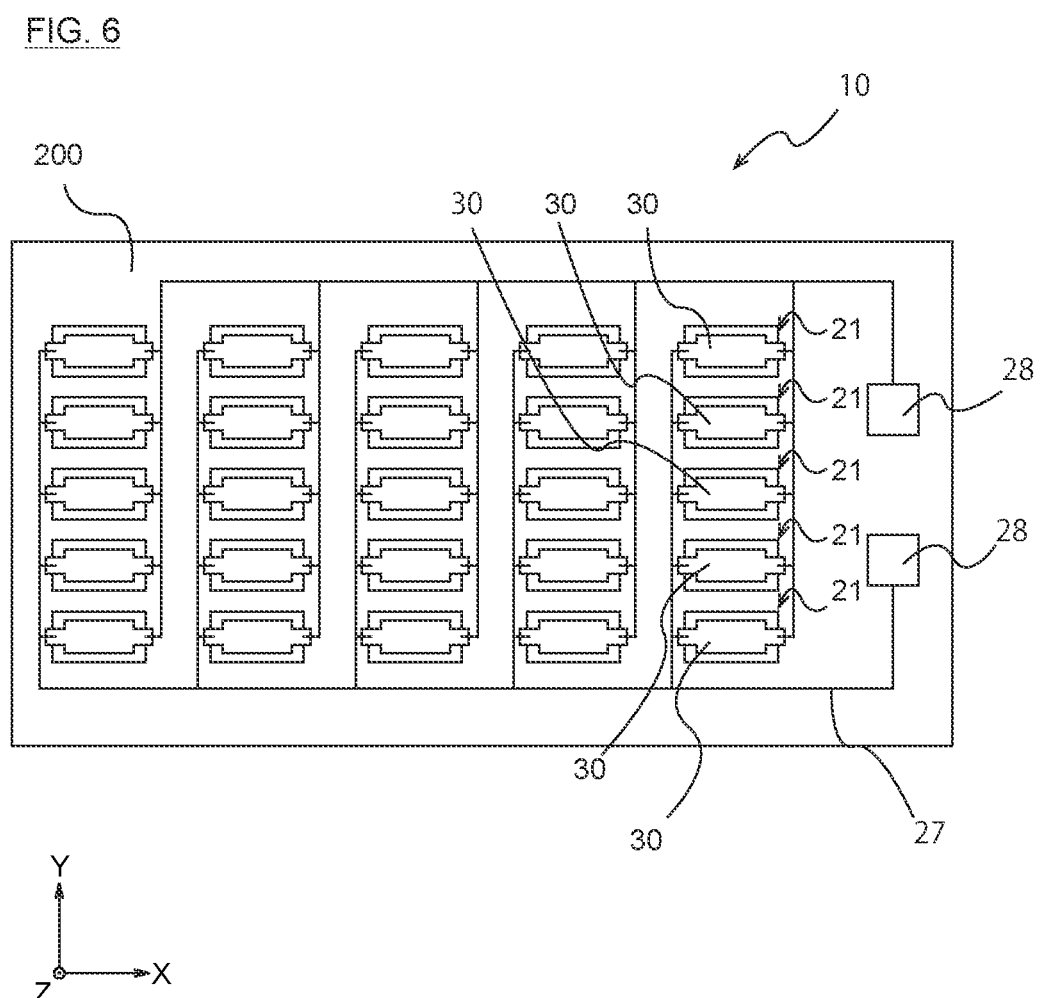

FIG. 6 is a plan view of an example electronic device according to an embodiment of the present disclosure.

Figure 7:
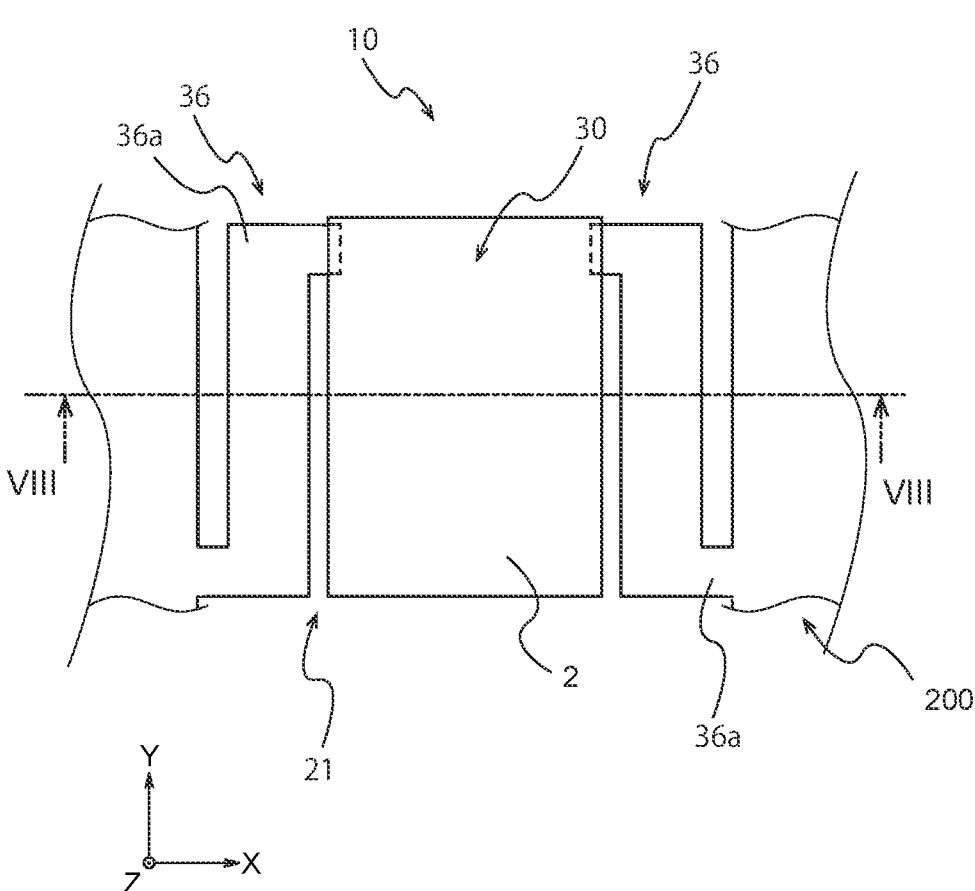

FIG. 7 is a plan view of a vibrator and its surrounding structure of the electronic device shown in FIG. 6.

Figure 8:
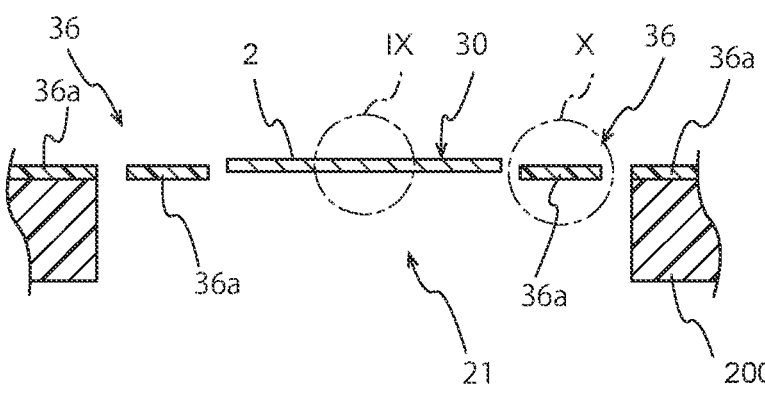
Figure 8:
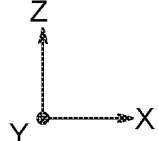

FIG. 8 is a sectional view of the vibrator and its surrounding structure along line VIII-VIII of FIG. 7.

Figure 9:
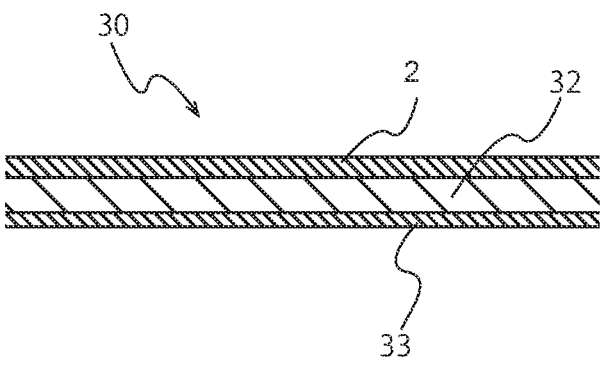
Figure 9:
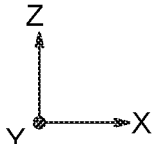

FIG. 9 is an enlarged sectional view of an internal structure of the vibrator shown in part IX of FIG. 8.

Figure 10:
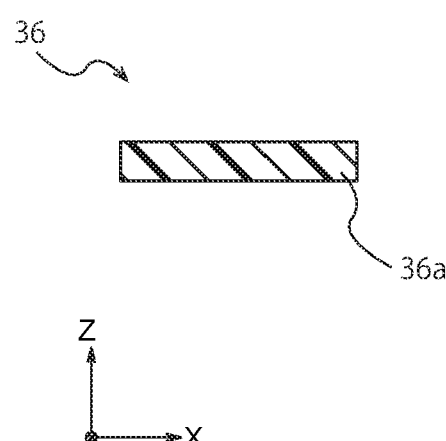

FIG. 10 is an enlarged sectional view of an internal structure of a supporting member shown in part X of FIG. 8.

Figure 11:
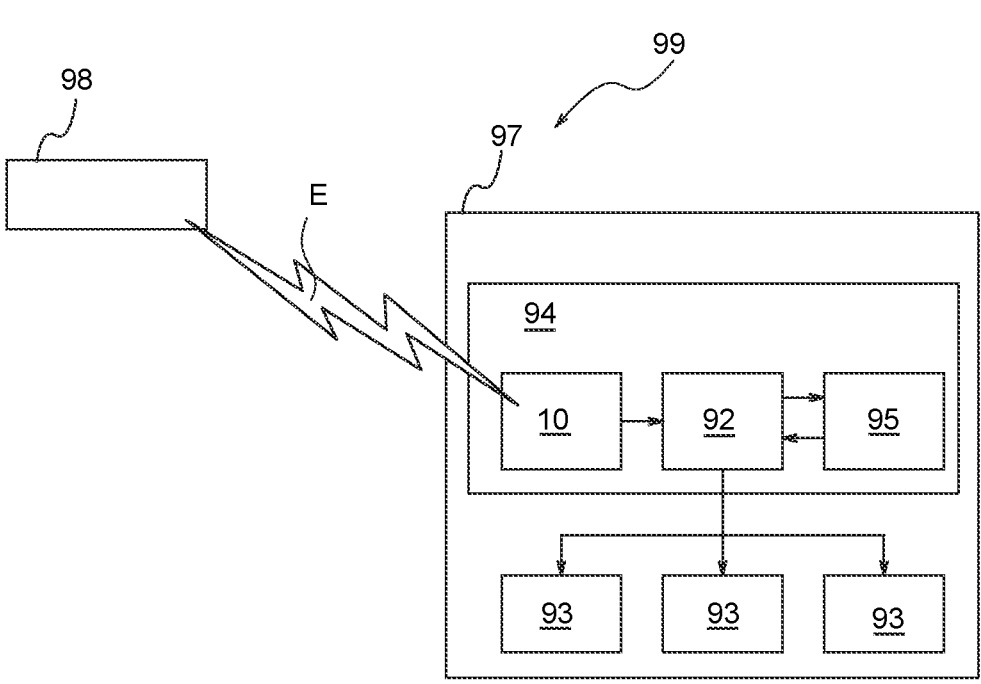

FIG. 11 is a schematic view of an electronic apparatus including the electronic device shown in FIG. 6.

DETAILED DESCRIPTION

Hereinafter, embodiments of the present disclosure are described.

First Embodiment

As shown in FIG. 1, a magnetostrictive film 2 according to an embodiment of the present disclosure can be provided indirectly above or directly above a substrate 4. The phrase "be provided indirectly above" indicates that other functional films, such as a buffer layer, an electrode film, and a piezoelectric thin film, may be disposed between the magnetostrictive film 2 and the substrate 4. In FIG. 1, the magnetostrictive film 2 extends along a plane containing the X-axis and the Y-axis and includes a main surface 20a closer to the substrate 4 and a main surface 20b across the substrate 4. Note that the film thickness direction of the magnetostrictive film 2 corresponds to the Z-axis and that the X-axis, the Y-axis, and the Z-axis are perpendicular to each other.

The substrate 4 may be made from any material. For example, the material is preferably single crystalline but may be polycrystalline or amorphous. Examples of the substrate 4 include Si, PZT, MgO, strontium titanate (SrTiO₃), lithium niobate (LiNbO₃), and glass. The shape and dimensions of the substrate 4 are not limited and are determined as appropriate according to the type or purpose of a device in which the magnetostrictive film 2 is included.

The magnetostrictive film 2 is preferably amorphous and particularly preferably includes an amorphous soft magnetic alloy. Examples of soft magnetic alloys include Fe—Si—B based alloys, Fe—Cr—Si—B based alloys, Fe—Ni—Mo—B based alloys, Fe—Co—B based alloys, Fe—Ni—B based alloys, Fe—Al—Si—B based alloys, Fe—Co—Si—B based alloys, Fe—Si—B—Cu—Nb based alloys, Co—Fe—Ni—Si—B—Mo based alloys, Fe—Ga—B based alloys, Fe—Sm—B based alloys, and Fe—Tb—B based alloys. A section of the magnetostrictive film 2 includes an amorphous phase composed of the above-mentioned soft magnetic alloy as a main phase.

"Amorphous" indicates a condition of an atom arrangement not having crystal-like long range order but having short range order. The atom arrangement of the magnetostrictive film 2 can be analyzed using, for example, a three-dimensional atom probe (3DAP), X-ray diffraction (XRD), electron diffraction with a transmission electron microscope (TEM), fast Fourier transform (FFT) processing of a TEM image, image analysis based on phase contrast of a TEM image, and neutron diffraction (ND). When a diffraction peak or a diffraction spot is observed in XRD or electron diffraction, presence of long range order attributed to a crystal can be determined. When a halo pattern is observed in XRD or electron diffraction, presence of an amorphous short range order can be determined. Note that long range order and short range order are compatible.

For example, when a structural analysis of the magnetostrictive film 2 is performed using $2\theta/\theta$ measurement with XRD, it is desirable that the resulting XRD pattern of the magnetostrictive film 2 have a broad halo pattern with a half width of 0.5° or more within a range of $2\theta=30°$ to 60° and that no diffraction peak attributed to a crystal be observed. When the structural analysis of the magnetostrictive film 2 is performed using electron diffraction with a TEM, it is preferable that a concentric halo pattern having a blurry outline be observed and that no diffraction spot attributed to a crystal or no Debye-Scherrer ring indicating presence of a polycrystal be observed.

Although the main phase of the magnetostrictive film 2 of the present embodiment is the amorphous phase as mentioned earlier, the magnetostrictive film 2 may include a crystal phase having long range order. When the magnetostrictive film 2 includes the crystal phase, a peak attributed to the crystal phase may be observed in the XRD pattern of the magnetostrictive film 2, together with the halo pattern attributed to the amorphous phase. However, the amorphous ratio of the magnetostrictive film 2 is preferably 90% or more, more preferably 95% or more, or still more preferably 100%.

The amorphous ratio can be calculated using, for example, the area ratio of the amorphous phase in a section of the magnetostrictive film 2. In a TEM image or a HRTEM image based on phase contrast, it can be confirmed that a crystalline portion in the image has lattices arranged systematically whereas an amorphous portion therein has a random pattern with no regularity. Thus, the crystal phase and the amorphous phase can be distinguished based on the phase contrast for estimating the area ratio of the amorphous phase.

The magnetostrictive film 2 may have any thickness $t_m$. For example, the thickness $t_m$ may fall within 10 nm to 10 μm or within 300 nm to 1 μm. The thickness $t_m$ is found by, for example, analyzing a sectional image like FIG. 1. For example, unevenness of the thickness $t_m$ preferably falls within ±5%.

FIG. 1 shows a longitudinal section of the magnetostrictive film 2, orthogonal to an X-Y plane. When an Fe mapping image of a cross section (perpendicular to the Z-axis) of the magnetostrictive film 2 is taken with a three-dimensional atom probe at multiple points included in a substantial center part in the film thickness direction (Z-axis direction) of this longitudinal section, the image taken at each point demonstrates results as in FIG. 2.

Note that, in FIG. 2, the field of view falls within a circle having a predetermined diameter (e.g., 60 nm). In FIG. 2, the closer the color is to black (dark color), the higher the Fe concentration; and rich regions 2a having a higher Fe concentration than the surroundings are observed in a mesh pattern. Between the rich regions 2a are poor regions 2b poorer in Fe than the rich regions 2a. The poor regions 2b include portions surrounded by the rich regions 2a continuously or intermittently aligned with each other. Note that the poor regions 2b may include, for example, at least one element selected from the group consisting of B, Si, C, Al, P, Ge, As, Sb, S, Ga, and Sn.

In the present embodiment, the closer the color is to black (dark color), the higher the Fe concentration; and the closer the color is to white (bright color), the lower the Fe concentration. However, the dark color and the bright color may be vice versa.

The rich regions 2a have a width W. The width W preferably falls within 1 to 10 nm or more preferably falls within 2 to 6 nm or 2 to 5 nm.

In measurement of the Fe concentration distribution at 1-nm intervals at 61 points in an area (X: 5 nm, Y: 60 nm, Z: 5 nm) subject to analysis along an imaginary straight line HL having a predetermined length and penetrating a center of the field of view in a circle having a predetermined diameter (e.g., 60 nm) shown in FIG. 2, at least a predetermined number of local maximums ("x" marked in FIG. 4A1) of the Fe content ratio (atom %) are observed as shown in FIG. 4A1.

The local maximums of the Fe content ratio (atom %) shown in FIG. 4A1 correspond to locations of maximum peaks of the Fe concentrations of the respective rich regions 2a on the imaginary straight line HL shown in FIG. 2. Also, between the local maximums next to each other shown in FIG. 4A1 is a local minimum of the Fe content ratio (atom %). The local minimums correspond to locations of minimum peaks of the Fe concentrations of the respective poor regions 2b on the imaginary straight line HL shown in FIG. 2.

From the Fe concentration profile shown in FIG. 4A1, the rich regions 2a can be defined as regions having an Fe concentration that is higher than the local minimums of the Fe concentrations of the adjacent poor regions 2b by preferably 0.5 at % or more, more preferably 1.0 at % or more, or still more preferably 1.5 at % or more. Alternatively, the rich regions 2a can be defined as regions having an Fe concentration that is higher than the average Fe concentration of the field of view of FIG. 4A1 by preferably 0.2 at % or more or by more preferably 0.4 at % or more or 0.8 at % or more.

In the present embodiment, as shown in FIG. 4A1, preferably at least five local maximums or more preferably at least seven local maximums are observed within the imaginary straight line HL having a length of 60 nm. In the present embodiment, a distance (also referred to as period) L between the local maximums next to each other falls within a range of preferably 3 to 15 nm or more preferably 5 to 10 nm.

Figure 3:
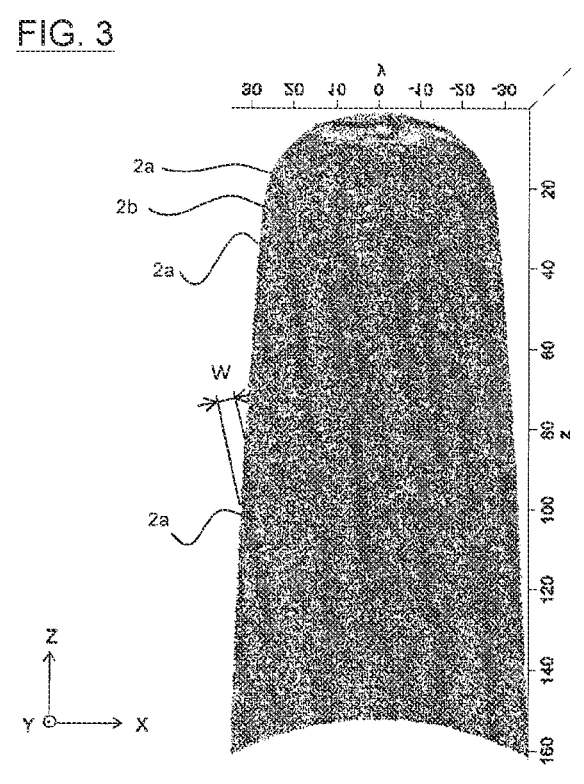

As shown in FIG. 3, the rich regions 2a having the predetermined width W continues for at least a predetermined height in the film thickness direction (Z-axis direction). Also, in the longitudinal section shown in FIG. 3, the rich regions 2a are observed in vertical stripes with the poor regions 2b therebetween. The direction in which the rich regions 2a in vertical stripes extend is substantially parallel to the Z-axis but may be slightly inclined at an angle within preferably ±45 degrees or more preferably ±30 degrees.

The predetermined height for which the rich regions 2a continue depends on the thickness $t_m$ of the magnetostrictive film 2 shown in FIG. 1. However, the predetermined height is preferably 20% or more of the thickness of the magnetostrictive film 2, more preferably 50% or more of the thickness, or still more preferably 80% or more or 100% of the thickness. Also, preferably at least five or more preferably at least seven vertical stripes of the rich regions 2a having such predetermined height are observed along the X-axis or the Y-axis in, for example, the field of view shown in FIG. 3.

In the present embodiment, regarding the phrase "the rich regions 2a continue," the rich regions 2a are deemed to be entirely continued in FIG. 2 or FIG. 3 except when being intermittent due to presence of the poor regions 2b at intervals having the predetermined width W or more. Also, in the present embodiment, vertical stripes do not necessarily have to be in straight lines and may include undulations, wavy portions, thunderbolt-like portions, etc.; and at least one of the vertical stripes may be branched. The magnetostrictive film 2 of the present embodiment, in which the rich regions 2a are observed in a mesh pattern in the cross section shown in FIG. 2 and in vertical stripes in the longitudinal section shown in FIG. 3 as described, can have a reduced magnetic field threshold $H_{TH}$ and have a large magnetostriction constant $d\lambda/dH$.

As the magnetostrictive film 2 has the low magnetic field threshold $H_{TH}$, the electronic device including the magnetostrictive film 2 can respond quickly to a small external magnetic field. Also, as the magnetostrictive film 2 has the large magnetostriction constant $d\lambda/dH$, the electronic device including the magnetostrictive film 2 can have high input-output conversion efficiency and produce a larger output for a predetermined input signal. Having the high conversion efficiency, the electronic device including the magnetostrictive film 2 is easily reduced in size.

The magnetostrictive film 2 of the present embodiment can be included in various devices, such as actuators, speakers, magnetometers, energy conversion devices, oscillators, and micropumps. Examples of magnetometers include magnetic current sensors for detection using electromotive force of a piezoelectric substrate laminated on a magnetostrictive film and resonance-type magnetometers in which a piezoelectric film and a magnetostrictive film are laminated on a Si cantilever. The magnetostrictive film 2 can also be included in electronic devices having a structure in which the magnetostrictive film and a piezoelectric film are laminated, such as apparatuses for converting electricity into magnetism and vice versa.

A method of producing the magnetostrictive film 2 shown in FIG. 1 is now described. The magnetostrictive film 2 can be formed directly above or indirectly above the substrate 4 using a vacuum accumulation method. Examples of vacuum accumulation methods include sputtering, vacuum deposition, pulsed laser deposition (PLD), and ion beam deposition (IBD). In particular, sputtering is preferable. To form the magnetostrictive film 2 including an amorphous structure, film formation conditions, such as a degree of vacuum, a substrate temperature, an inert gas flow rate, and a film formation pressure, are preferably controlled within predetermined ranges.

When the film is formed by sputtering, the degree of vacuum at the time of film formation is preferably 0.1 Pa or less, more preferably 0.05 Pa or less, or still more preferably 0.02 to 0.05 Pa. The degree of vacuum at the time of film formation indicates the total pressure of a process gas and other gases, such as a residual gas, in a film formation chamber during film formation; and the lower the value, the higher the degree of vacuum. The pressure inside the film formation chamber prior to film formation is preferably $1.0\times10^{-5}$ Pa or less, more preferably $5.0\times10^{-6}$ Pa or less, or still more preferably $1\times10^{-6}$ to $5.0\times10^{-6}$ Pa.

Setting the temperature of the substrate 4 at the time of film formation low while the degree of vacuum prior to film formation is set high as described above enables the magnetostrictive film 2 including the rich regions 2a having a mesh pattern in the cross section shown in FIG. 2 to be readily produced. Specifically, the substrate temperature is preferably less than 60° C. or more preferably 15° C. to 40° C.

At the time of film formation, an inert gas (e.g., Ar) is introduced. The flow rate of the inert gas is preferably 30 sccm or more and 150 sccm or less.

The film formation pressure is preferably 0.016 Pa or more and 0.08 Pa or less. Note that the unit "sccm" indicates the flow rate converted (standard conversion) to $cm^3/min$ at 1 atm (1013 hPa) at 25° C.

In the present embodiment, it is assumed that conditions of annealing after film formation, as well as the film formation conditions (e.g., substrate temperature), affect generation of the rich regions in a mesh pattern. Reasons why the film formation conditions or the annealing conditions affect generation of the rich regions in a mesh pattern are not necessarily clarified but may be as follows.

It is assumed that facilitation of generation of the rich regions is attributed to migration (movement) of elements during film formation or annealing. It is assumed that the likelihood or degree of element migration depends on the film formation temperature, the annealing conditions, etc., and that certain conditions enable the amorphous structure to include the rich regions in a mesh pattern.

After the magnetostrictive film 2 is formed on the substrate 4, the magnetostrictive film 2 may be patterned by, for example, etching or lift-off. Also, the substrate 4 may be subject to processing, such as cutting and etching.

Note that, after the magnetostrictive film 2 is formed on the substrate 4 and before or after patterning, annealing of the magnetostrictive film 2 is preferably performed. Annealing enables further reduction of the magnetic field threshold $H_{TH}$ of the magnetostrictive film 2 and further increase of the magnetostriction constant. Annealing conditions are not limited. The annealing temperature is preferably 100 to 400° C., more preferably 200 to 400° C., or still more preferably 250 to 350° C.

Second Embodiment

FIG. 6 is a plan view of an electronic device 10 according to a second embodiment. The electronic device 10 includes vibrators (laminated bodies) 30. The electronic device 10 also includes a common frame 200 having openings 21 and the like. The common frame 200 may be composed of the substrate 4 of the first embodiment shown in FIG. 1.

As described later, each of the vibrators 30 disposed on the common frame 200 includes a laminated body (also referred to as a magnetoelectric conversion element) including the magnetostrictive film 2 (the same magnetostrictive film of the first embodiment) and a piezoelectric film 32. The vibrators 30 can receive electrical signals, electrical energy, etc. from an external magnetic field or generate electromagnetic waves based on the electric signals, etc. The electronic device 10 can be used as, for example, an antenna device for receiving external electricity or external signals in an electronic apparatus 97, but uses of the electronic device 10 are not limited to antenna devices.

As shown in FIG. 6, the electronic device 10 includes, for example, a total of twenty-five vibrators 30 (the number may be smaller or larger) in the drawing. The vibrators 30 are aligned along the X-axis direction and the Y-axis direction.

Arrangement of the vibrators included in the electronic device 10 is not limited to arrangement in two-dimensional arrays shown in FIG. 6. The vibrators may be aligned in other arrangement, such as in one-dimensional array and in concentric circles. Although the same pattern of the vibrators included in the electronic device 10 is repeated for multiple times (five times in the present embodiment) in the X-axis direction, the pattern and the number of repetition are not limited to those of the embodiment shown in FIG. 6.

The common frame 200 shown in FIG. 6 has the openings 21 where the respective vibrators 30 are disposed in a matrix. For example, the common frame 200 may be composed of a silicon substrate, and the electronic device 10 may be composed of MEMS.

The openings 21 of the common frame 200 are provided using a semiconductor microfabrication technique, such as etching. However, the common frame 200 is not limited to a silicon substrate and may be other wiring boards, such as a flexible printed circuit board and a rigid circuit board.

As shown in FIG. 6, on a surface of the common frame 200 is a wiring member 27 connected to the vibrators 30. The wiring member 27 electrically connects the vibrators 30 included in the electronic device 10 in parallel. Both ends of the wiring member 27 are provided with respective external connection members 28, which are electrical contact points with an external wiring. The wiring member 27 and the external connection members 28 are composed of, for example, a conductive film pattern made from a good conductor, such as copper (Cu) and gold (Au).

In the description of the electronic device 10, the depth direction (direction orthogonal to an XY plane at the entrances of the openings 21) of the openings 21, where the vibrators 30 are disposed, is the Z-axis direction; the direction that is perpendicular to the Z-axis direction and along which the vibrators 30 are aligned in parallel when viewed from the Z-axis direction is the Y-axis direction; and the direction perpendicular to the Z-axis and the Y-axis is the X-axis direction.

Hereinafter, the vibrators 30 and their surrounding structure are described in more detail. FIG. 7 is a plan view of one of the vibrators 30 and its surroundings viewed from the positive direction of the Z-axis. FIG. 8 is a sectional view along the cutting plane line VIII-VIII shown in FIG. 7. The vibrator 30 has a substantially flat external shape and is disposed near the plane at the entrance of the corresponding opening 21 so that the entrance of the opening 21 is partly blocked. As shown in FIGS. 7 and 8, the vibrator 30 is disposed at a near-center of the opening 21 in the X-axis direction.

FIG. 9 is a partly enlarged view of the vibrator 30 shown in part IX of FIG. 8. As shown in FIG. 9, the vibrator 30 includes the magnetostrictive film 2, the piezoelectric film 32 stacked below the magnetostrictive film 2, and an electrode film 33 stacked below the piezoelectric film 32. The vibrator 30 has a multi-film laminated structure including the magnetostrictive film 2, the piezoelectric film 32, and the electrode film 33.

As shown in FIG. 9, in the vibrator 30, the piezoelectric film 32 is stacked below the magnetostrictive film 2 along the Z-axis, and the electrode film 33 is stacked below the piezoelectric film 32 along the Z-axis. However, as the vibrator 30, the piezoelectric film 32 may be stacked above the magnetostrictive film 2 along the Z-axis, and the electrode film 33 may be stacked above the piezoelectric film 32 along the Z-axis, contrary to illustration of FIG. 9. The direction of lamination is not limited.

Although not shown in FIG. 9, the magnetostrictive film 2, the piezoelectric film 32, and the electrode film 33 may have other films inserted therebetween. For example, between the magnetostrictive film 2 and the piezoelectric film 32 may be another electrode layer that pairs up with the electrode film 33. Also, for example, an insulation film protecting an upper surface of the vibrator 30 may be provided on the magnetostrictive film 2.

The magnetostrictive film 2 shown in FIG. 9 may have any average thickness in the Z-axis direction. For example, the average thickness of the magnetostrictive film 2 can be 0.1 μm to 5 μm.

The piezoelectric film 32 shown in FIG. 9 may have any average thickness in the Z-axis direction. For example, the average thickness of the piezoelectric film 32 can be 0.4 μm to 10 μm. The piezoelectric film 32 is composed of a piezoelectric material and exhibits the piezoelectric effect or the inverse piezoelectric effect. Examples of piezoelectric materials constituting the piezoelectric film 32 include clear quartz, lithium niobate, aluminum nitride (AlN), zinc oxide (ZnO), lead zirconate titanate (PZT: $Pb(Zr,Ti)O_3$), potassium sodium niobate (KNN: $(K,Na)NbO_3$), and barium calcium zirconate titanate (BCZT: $(Ba,Ca)(Zr,Ti)O_3$).

The electrode film 33 shown in FIG. 9 may have any average thickness in the Z-axis direction. For example, the average thickness of the electrode film 33 can be 3 nm to 200 nm. The electrode film 33 may be composed of a conductive material, such as metal and oxide conductors. Examples of the electrode film 33 include thin films of metal (e.g., platinum (Pt), iridium (Ir), and gold (Au)) having a face-centered cubic structure and thin films made from oxide conductors (e.g., strontium ruthenate ($SrRuO_3$) and lithium nickel oxide ($LiNiO_3$)). Note that, when another electrode film is provided between the magnetostrictive film 2 and the piezoelectric film 32, the average thickness of the another electrode film in the Z-axis direction and the material of the another electrode film may be the same as those of the electrode film 33 or may be different from those of the electrode film 33.

For forming the magnetostrictive film 2, the piezoelectric film 32, and the electrode film 33 of the vibrator 30, various thin film formation methods known as microfabrication techniques for semiconductor manufacturing processes may be used. Examples of thin film formation methods include vacuum deposition, sputtering, sol-gel, chemical vapor deposition (CVD), PLD, and ion beam deposition (IBD).

For example, laminating the electrode film 33, the piezoelectric film 32, and the magnetostrictive film 2 on an upper surface of a silicon substrate that becomes the common frame 200 in the order mentioned and molding the resulting laminated body into a predetermined shape and predetermined dimensions by etching or the like can produce the vibrator 30. On an upper surface of the magnetostrictive film 2 in the Z-axis direction or a lower surface of the electrode film 33 in the Z-axis direction, an insulating film made from silicon oxide, silicon nitride, etc. may be formed by the above-mentioned thin film formation methods. Such an insulating film contributes to improvement of mechanical strength and durability of the vibrator 30.

When energy of an external magnetic field, such as an electromagnetic wave and an alternating magnetic field, is emitted to the vibrator 30 shown in FIGS. 8 and 9, the vibrator 30 is excited by the energy of the external magnetic field to cause elastic wave vibration. More specifically, when the vibrator 30 receives the energy of the external magnetic field, in-plane stretching vibration of the magnetostrictive film 2 occurs due to the magnetostrictive effect. When the in-plane stretching vibration occurs, bias of electric charge is generated at a surface of the piezoelectric film 32 due to the piezoelectric effect of the piezoelectric film 32 of the vibrator 30. The potential difference at the piezoelectric film 32 may be extracted using the magnetostrictive film 2 functioning as the another electrode film and the electrode film 33. That is, the elastic wave vibration of the vibrator 30 enables the energy of the external magnetic field (e.g., electromagnetic wave and alternating magnetic field) or signals to be converted into electrical energy or electrical signals.

As shown in FIG. 8, the vibrator 30 is located at an upper portion of the opening 21 of the common frame 200. In the longitudinal section shown in FIG. 8, the vibrator 30 looks floating at the upper portion of the opening 21 in the Z-axis direction or inside the opening 21. As shown in FIG. 8, portions of the upper and lower surfaces of the vibrator 30 other than portions thereof overlapping supporting members 36 (described later) in a plan view viewed from the film thickness direction of the magnetostrictive film 2 are exposed to a space where the vibrator 30 can freely vibrate. Such portions are unconstrained portions that do not directly touch the common frame 200 or the supporting members 36.

The electronic device 10 includes the pair of supporting members 36, which vibratably connects the vibrator 30 to the common frame 200. The supporting members 36 are disposed at respective ends of the vibrator 30 in the X-axis direction. As shown in FIG. 7, the width of the vibrator 30 in the X-axis direction is smaller than the width of the opening 21 in the X-axis direction, and a space is provided between the vibrator 30 and the brim of the opening 21. The supporting members 36 are disposed so as to partly block the space between the vibrator 30 and the brim of the opening 21.

At the space between the vibrator 30 and the brim of the opening 21, each supporting member 36 extends along the X-axis direction and the Y-axis direction and is connected to the vibrator 30 at one end and to the common frame 200 at the other end. The supporting members 36, with the vibrator 30 disposed therebetween, have a symmetrical shape having a reference line penetrating a center of the vibrator 30 and extending in the Y-axis direction as an axis of symmetry.

FIG. 10 is an enlarged sectional view of part X of one of the supporting members 36 shown in FIG. 8 and disposed in the space between the vibrator 30 and the brim of the opening 21. As shown in FIG. 10, the supporting member 36 includes a beam material 36a.

The beam material 36a shown in FIG. 10 is composed of, for example, resin (e.g., polyimide, PET, plastic films), silicon, oxide, nitride, or metal. As shown in FIGS. 7 and 8, the beam material 36a continues from the vibrator 30 to the top of the common frame 200 and supports the vibrator 30 relative to the common frame 200. That is, the supporting member 36 is structured so that it overlaps the vibrator 30 (laminated body) in a plan view viewed from the Z-axis direction, which is the film thickness direction of the magnetostrictive film 2, to support the vibrator 30. The supporting member 36 may be formed integrally with the common frame 200.

A supporting-member electrode layer embedded in the beam material 36a is composed of a conductive material, similarly to the electrode film 33 of the vibrator 30 shown in FIG. 9. The supporting-member electrode layer electrically connects either the magnetostrictive film 2 or the electrode film 33 shown in FIG. 9 to the wiring member 27 of the common frame 200 shown in FIG. 6.

The supporting-member electrode layer of one supporting member 36 of the pair connects the magnetostrictive film 2 to the wiring member 27, and the supporting-member electrode layer of the other supporting member 36 of the pair connects the electrode film 33 to the wiring member 27. Via such supporting-member electrode layers, electric charge generated at the electrode film 33 is extracted outside the vibrator 30. Note that illustration of the supporting-member electrode layers is omitted in FIG. 7 and other drawings.

FIG. 11 is a schematic view of an example of the electronic apparatus 97 including the electronic device 10 shown in FIG. 6 and other drawings. A contactless power supply system 99 shown in FIG. 11 includes a transmission antenna 98 and the electronic apparatus 97. The transmission antenna 98 is installed apart from the electronic apparatus 97 and contactlessly supplies external energy E, such as electromagnetic waves and alternating magnetic fields, to the electronic apparatus 97. As the transmission antenna 98, for example, a dipole antenna, a monopole antenna, a loop antenna, a coil antenna, or a rectenna can be used. The transmission antenna 98 is not limited.

A power supply unit 94 of the electronic apparatus 97, which receives the energy, is composed of a capacitor 95 and a power management IC (PMIC) 92 including a rectifier circuit or the like connected to the electronic device 10 for integration. When the electronic device 10 of the power supply unit 94 receives the external energy E supplied from the transmission antenna 98, elastic wave vibration of the vibrators 30 shown in FIG. 6 is induced by the external energy E inside the electronic device 10, and electricity is generated in response to the elastic wave vibration.

As shown in FIG. 11, the electricity generated by the electronic device 10 is transmitted to the capacitor 95 via the power management IC 92 as an input unit for the electronic device 10 to input electrical signals and is stored in the capacitor 95. When the electronic apparatus 97 consumes electricity, the electricity stored in the capacitor 95 is transmitted via the power management IC 92 to electricity consuming units 93 of the electronic apparatus 97. Note that, for example, when the electronic apparatus 97 is a pair of in-ear earphones attached to external ears, the electricity consuming units 93 shown in FIG. 11 are piezoelectric speakers, piezoelectric microphones, pressure sensors, audio ICs including amplifiers, memories, or the like.

The contactless power supply system 99 can be applied to various electronic apparatuses, and types of the electronic apparatus 97 in which the electronic device 10 can be included are not limited. Having a small size and high efficiency, the electronic device 10 shown in FIG. 6 is particularly effective in application to small electronic apparatuses and apparatuses embedded in human bodies. Examples of such electronic apparatuses include various wearables, such as hearable devices (e.g., earphones and hearing aids), smartwatches, smart glasses, smart contact lenses, wearable thermometers, and wearable pulse wave sensors; cochlear implants and cardiac pacemakers attached inside human bodies; muscle or brain electro-stimulators; neuro-RFID; and microrobots.

The present disclosure is not limited to the above-mentioned embodiments and can variously be modified within the scope of the present disclosure.

For example, while Fe is exemplified as a specific element that contributes to ferromagnetism and is included in the rich regions 2a in the above-mentioned embodiments, the specific element may include at least one selected from the group consisting of Co, Ni, etc. other than Fe or together with Fe.

EXAMPLES

Hereinafter, the present disclosure is described based on further detailed examples, but the present disclosure is not to be limited thereto.

Example 1

A magnetostrictive film was formed on a silicon substrate so that the film had a composition of $Fe_{72}Co_8Si_{12}B_8$. An ultra-high vacuum DC sputtering apparatus was used to form the magnetostrictive film. Film formation conditions were as follows. The degree of vacuum prior to film formation was $1.0 \times 10^{-5}$ Pa or less. The degree of vacuum at the time of film formation was 0.05 Pa. The output was 200 W (DC). The applied magnetic field was 6400 A/m. The substrate temperature was 25° C. An Ar gas as an inert gas was supplied to the apparatus at a flow rate of 100 sccm. Note that, in Example 1, annealing after film formation was not performed.

After the magnetostrictive film was formed, the silicon substrate was cut into dimensions of 10 mm in the widthwise direction×40 mm in the lengthwise direction. The silicon substrate had an average thickness of 640 μm, and the magnetostrictive film had an average thickness $t_m$ of 500 nm. High frequency inductively coupled plasma (ICP) analysis was performed for analysis of the alloy composition of the magnetostrictive film to confirm that the composition was $Fe_{72}Co_8Si_{12}B_8$.

The following evaluation of the magnetostrictive film of Example 1 produced as described above was performed.
(ICP and XRD Analyses)

The alloy composition of the magnetostrictive film was analyzed using high frequency inductively coupled plasma (ICP) analysis to confirm that the composition of the magnetostrictive film of Example 1 was $Fe_{72}Co_8Si_{12}B_8$. A structural analysis of the magnetostrictive film was performed using XRD to confirm that only a halo pattern was observed within $2\theta=30°$ to 60° and no diffraction peak attributed to a crystal was detected in the resulting XRD pattern. That is, it was confirmed that the magnetostrictive film of Example 1 was amorphous with an amorphous ratio of 100%.

Table 1 shows the results. In the amorphous column of Table 1, "Y" indicates that the amorphous ratio of the magnetostrictive film 2 was 90% or more, and "N" indicates that the amorphous ratio of the magnetostrictive film 2 was less than 90%. In the crystal diffraction peak column of Table 1, "Y" indicates that a diffraction peak attributed to a crystal was detected, and "N" indicates that no diffraction peak attributed to a crystal was detected.
(3DAP Analysis)

For evaluation of the magnetostrictive film using 3DAP, the magnetostrictive film was processed into a needle-shaped sample. The sample had a predetermined thickness (depth) of the magnetostrictive film shown in FIG. 1 including, for example, the middle point of the thickness (500 nm) of the magnetostrictive film 2. A cross section (containing the X-axis and the Y-axis), which was a field of view, of the sample had a diameter of about φ60 nm. The sample had a height of about 200 nm in the thickness direction (Z-axis direction), which was the film formation direction, of the magnetostrictive film. When distribution of the alloy constituent elements in the cross section (containing the X-axis and the Y-axis) shown in FIG. 2 was obtained as a mapping image (FIG. 2: Fe mapping image), a portion of the needle-shaped sample sliced at 10-nm thickness was used as an observation surface. When distribution of the alloy constituent elements along the thickness direction (Z-axis direction), which was the film formation direction, of the magnetostrictive film shown in FIG. 3 was obtained as a mapping image (FIG. 3: Fe mapping image), a portion of the sample sliced at 5-nm thickness was used as an observation surface.

Regarding the mapping image of the cross section shown in FIG. 2, the atom percent of Fe as a specific element was measured in an area (X: 5 nm, Y: 60 nm, Z: 5 nm) subject to analysis along the imaginary straight line HL including a center of the field of view. FIG. 4A1 shows the results. From the results shown in FIGS. 2 and 4A1, whether the rich regions 2a rich in Fe had a mesh pattern was determined. Table 1 shows the results. In the XY plane mesh pattern column of Table 1, "Y" indicates that the following conditions were entirely satisfied, and "N" indicates that not all the conditions were satisfied.

In the XY plane mesh pattern column, "Y" indicates that the rich regions 2a having a width W that fell within 1 to 10 nm were observed in a mesh pattern in FIG. 2 and five or more local maximums ("x") of the Fe concentration were observed in FIG. 4A1, and "N" indicates that either or both of these conditions were not satisfied. In the XZ or YZ plane vertical stripes column, "Y" indicates that the rich regions 2a having a width W that fell within 1 to 10 nm were observed in vertical stripes in FIG. 3 and five or more vertical stripes of the rich regions 2a were observed along the X-axis or the Y-axis, and "N" indicates that either or both of these conditions were not satisfied.
(Magnetostriction Evaluation)

A curve (magnetic field-magnetostriction curve) showing relationship between magnetic fields and magnetostriction of the magnetostrictive film was measured. Using the magnetic field-magnetostriction curve, a magnetic field threshold $H_{TH}$ and a magnetostriction constant $d\lambda/dH$ were calculated. Specifically, an external rotating magnetic field of 0 to 6400 A/m was applied to the magnetostrictive film, and the strain amount generated at the magnetostrictive film was measured with a laser displacement sensor to give the magnetic field-magnetostriction curve.

The size of the external magnetic field at the time when a magnetostriction X. of 0.1 ppm was caused was calculated as the magnetic field threshold $H_{TH}$. The maximum value of the slope of the magnetic field-magnetostriction curve was calculated as the magnetostriction constant $d\lambda/dH$. Table 1 shows the results. Ex. 1 of FIG. 5 is an example curve of relationship between magnetic fields and magnetostriction of the magnetostrictive film of Example 1. In the case of the magnetostrictive films having an FeCoSiB based composition, the magnetic field threshold $H_{TH}$ was deemed good when it was less than 79.58 A/m (1 Oe), better when it was 32 A/m or less, or still better when it was 28 A/m or less.

Example 2

A magnetostrictive film was formed as in Example 1 except that annealing was performed at 250° C. after the magnetostrictive film was formed for the same evaluation. Table 1 shows the results. Ex. 2 of FIG. 5 is an example curve of relationship between magnetic fields and magnetostriction of the magnetostrictive film of Example 2.

Example 3

A magnetostrictive film was formed as in Example 1 except that annealing was performed at 350° C. after the magnetostrictive film was formed for the same evaluation.

Table 1 shows the results. FIG. 4A2 shows results of measuring an Fe concentration profile of Example 3. Ex. 3 of FIG. 5 is an example curve of relationship between magnetic fields and magnetostriction of the magnetostrictive film of Example 3.

Example 4

A magnetostrictive film was formed as in Example 2 except that lead zirconate titanate (PZT) was used instead of Si as a substrate for the same evaluation. Table 1 shows the results.

Comparative Example 1

A magnetostrictive film was formed as in Example 1 except that annealing was performed at 450° C. after the magnetostrictive film was formed for the same evaluation. Table 1 shows the results. Cex. 1 of FIG. 5 is an example curve of relationship between magnetic fields and magnetostriction of the magnetostrictive film of Comparative Example 1. FIG. 4B shows results of measuring an Fe concentration profile of Comparative Example 1 as in Example 1. As shown in FIG. 4B, the number of local maximums in a distance of 60 nm was four or less, and at least one distance L between the local maximums next to each other was 15 nm or more.

Comparative Example 2

A magnetostrictive film was formed as in Example 1 except that a substrate holder for holding the substrate was cooled with liquid nitrogen during film formation for the same evaluation. Table 1 shows the results. Cex. 2 of FIG. 5 is an example curve of relationship between magnetic fields and magnetostriction of the magnetostrictive film of Comparative Example 2.

Examples 5 to 8

Magnetostrictive films were formed as in Example 2 except that the compositions of the respective magnetostrictive films were CoFeB $((Co_{75}Fe_{25})_{80}B_{20})$, FeGaB $((Fe_{80}Ga_{20})_{85}B_{15})$, FeSmB $((Fe_{80}Sm_{20})_{90}B_{10})$, and FeNiB $((Fe_{75}Ni_{25})_{80}B_{20})$ for the same evaluation. Table 2 shows the results.

Comparative Examples 5 to 8

Magnetostrictive films were formed as in Examples 5 to 8 except that annealing was performed at 450° C. for the same evaluation. Table 2 shows the results.

TABLE 1

|  | Magneto-strictive film composition | Substrate | Film formation conditions | | | | |
|---|---|---|---|---|---|---|---|
|  |  |  | Ar gas flow rate (sccm) | Film formation pressure (Pa) | Film formation power (W) | Applied magnetic field (A/m) | Annealing temperature (° C.) |
| Example 1 | FeCoSiB | Si | 100 | 0.05 | 200 | 6400 | — |
| Example 2 | FeCoSiB | Si | 100 | 0.05 | 200 | 6400 | 250 |
| Example 3 | FeCoSiB | Si | 100 | 0.05 | 200 | 6400 | 350 |
| Example 4 | FeCoSiB | PZT | 100 | 0.05 | 200 | 6400 | 250 |
| Comparative Example 1 | FeCoSiB | Si | 100 | 0.05 | 200 | 6400 | 450 |
| Comparative Example 2 | FeCoSiB | Si | 100 | 0.05 | 200 | 6400 | — |

|  | Magnetostrictive film structure (XRD) | | 3DAP | | Magnetic field threshold $H_{TH}$ (A/m) | Magneto-striction constant $d\lambda/dH$ (ppb · m · A$^{-1}$) |
|---|---|---|---|---|---|---|
|  | Amorphous | Crystal diffraction peak | XY plane mesh pattern | XZ or YZ plane vertical stripes |  |  |
| Example 1 | Y | N | Y | Y | 25 | 35 |
| Example 2 | Y | N | Y | Y | 31 | 146 |
| Example 3 | Y | N | Y | Y | 26 | 1116 |
| Example 4 | Y | N | Y | Y | 30 | 150 |
| Comparative Example 1 | N | Y | N | N | 294 | 117 |
| Comparative Example 2 | Y | N | N | N | 215 | 29 |

TABLE 2

|  | Magneto-strictive film composition | Substrate | Film formation conditions | | | | |
|---|---|---|---|---|---|---|---|
|  |  |  | Ar gas flow rate (sccm) | Film formation pressure (Pa) | Film formation power (W) | Applied magnetic field (A/m) | Annealing temperature (° C.) |
| Example 5 | CoFeB | Si | 100 | 0.05 | 200 | 6400 | 250 |
| Comparative Example 5 | CoFeB | Si | 100 | 0.05 | 200 | 6400 | 450 |
| Example 6 | FeGaB | Si | 100 | 0.05 | 200 | 6400 | 250 |
| Comparative Example 6 | FeGaB | Si | 100 | 0.05 | 200 | 6400 | 450 |

TABLE 2-continued

| Example 7 | FeSmB | Si | 100 | 0.05 | 200 | 6400 | 250 |
| Comparative Example 7 | FeSmB | Si | 100 | 0.05 | 200 | 6400 | 450 |
| Example 8 | FeNiB | Si | 100 | 0.05 | 200 | 6400 | 250 |
| Comparative Example 8 | FeNiB | Si | 100 | 0.05 | 200 | 6400 | 450 |

| | Magnetostrictive film structure (XRD) | | 3DAP | | Magnetic field |
| --- | --- | --- | --- | --- | --- |
| | | | | XZ or YZ | |
| | Amorphous | Crystal diffraction peak | XY plane mesh pattern | plane vertical stripes | threshold $H_{TH}$ (A/m) |
| Example 5 | Y | N | Y | Y | 16 |
| Comparative Example 5 | N | Y | N | N | 256 |
| Example 6 | Y | N | Y | Y | 72 |
| Comparative Example 6 | N | Y | N | N | 328 |
| Example 7 | Y | N | Y | Y | 86 |
| Comparative Example 7 | N | Y | N | N | 289 |
| Example 8 | Y | N | Y | Y | 160 |
| Comparative Example 8 | N | Y | N | N | 456 |

Evaluation 1

As shown in Table 1, it was confirmed that $H_{TH}$ of the magnetostrictive film of each of Examples 1 to 4, in which the rich regions 2a were observed with a 3DAP in a mesh pattern in the cross section of the magnetostrictive film as shown in FIG. 2 and in vertical stripes in the longitudinal section of the magnetostrictive film as shown in FIG. 3, was lower than those of Comparative Examples 1 and 2. In particular, it was confirmed that the magnetostriction constants of the respective magnetostrictive films of Examples 2 and 3 were higher than that of Example 1.

Evaluation 2

As shown in Table 2, it was confirmed that the results were the same as in Example 2 and Comparative Example 1 despite the compositions of the magnetostrictive films being changed. That is, it was confirmed that $H_{TH}$ of the magnetostrictive film of each of Examples 5 to 8 was lower than those of Comparative Examples 5 to 8.

REFERENCE NUMERALS

2 . . . magnetostrictive film
2a . . . rich region
2b . . . poor region
20a, 20b . . . main surface (film surface)
4 . . . substrate
10 . . . electronic device
200 . . . common frame
21 . . . opening
27 . . . wiring member
28 . . . external connection member
30 . . . vibrator (laminated body)
32 . . . piezoelectric film
33 . . . electrode film
36 . . . supporting member
36a . . . beam material
92 . . . power management IC
95 . . . capacitor
93 . . . electricity consuming unit
97 . . . electronic apparatus
98 . . . transmission antenna

What is claimed is:

1. A magnetostrictive film comprising rich regions having stripe-shapes in a longitudinal section parallel to a film thickness direction of the magnetostrictive film and having a mesh pattern in a cross section perpendicular to the film thickness direction of the magnetostrictive film, the rich regions being richer in a specific element contributing to ferromagnetism than surroundings of the rich regions, and
comprising a poor region between the rich regions in the cross section, the poor region including the specific element but being poorer in the specific element than the rich regions and having a portion surrounded by the rich regions continuously or intermittently aligned with each other.

2. The magnetostrictive film according to claim 1, wherein the rich regions continue for at least a predetermined height in the film thickness direction.

3. The magnetostrictive film according to claim 1, wherein the rich regions have a width of 1 to 10 nm in the cross section.

4. The magnetostrictive film according to claim 1, wherein
local maximums of a concentration of the specific element are observed along an imaginary straight line having a predetermined length in the cross section; and
a distance between the local maximums next to each other falls within 3 to 15 nm.

5. The magnetostrictive film according to claim 4, wherein the local maximums of the concentration of the specific element comprise at least five local maximums within the imaginary straight line having a length of 60 nm.

6. The magnetostrictive film according to claim 1, wherein the magnetostrictive film is amorphous.

7. The magnetostrictive film according to claim 1, wherein the specific element comprises at least Fe.

8. An electronic device comprising the magnetostrictive film according to claim 1.

9. The electronic device according to claim 8, comprising:
a laminated body including the magnetostrictive film and a piezoelectric body; and
a supporting member supporting the laminated body and overlapping the laminated body in a plan view viewed from the film thickness direction of the magnetostrictive film.

10. The magnetostrictive film according to claim 1, that when the magnetostrictive film has an FeCoSiB based composition, it has a magnetic field threshold $H_{TH}$ less than 79.58 A/m (1 Oe).

11. A magnetostrictive film comprising rich regions having stripe-shapes in a longitudinal section parallel to a film thickness direction of the magnetostrictive film and having a mesh pattern in a cross section perpendicular to the film thickness direction of the magnetostrictive film, the rich regions being richer in a specific element contributing to ferromagnetism than surroundings of the rich regions, wherein a region between the rich regions also includes the specific element, local maximums of a concentration of the specific element are observed along an imaginary straight line having a predetermined length in the cross section; and a distance between the local maximums next to each other falls within 3 to 15 nm, and wherein the local maximums of the concentration of the specific element comprise at least five local maximums within the imaginary straight line having a length of 60 nm.

\* \* \* \* \*